US009297366B2

(12) United States Patent
Paripati et al.

(10) Patent No.: US 9,297,366 B2
(45) Date of Patent: Mar. 29, 2016

(54) THERMAL ENERGY CONVERSION TO ELECTRICITY

(71) Applicant: SUGANIT SYSTEMS, INC., Reston, VA (US)

(72) Inventors: Praveen Paripati, Reston, VA (US); Rahul Patil, Reston, VA (US); Gary Glenn Lipscomb, Reston, VA (US); Mahabala Adiga, Reston, VA (US)

(73) Assignees: SuGanit Systems Inc., Reston, VA (US); The University of Toledo, Toledo, OH (US)

( * ) Notice: Subject to any disclaimer, the term of this patent is extended or adjusted under 35 U.S.C. 154(b) by 0 days.

(21) Appl. No.: 14/017,044

(22) Filed: Sep. 3, 2013

(65) Prior Publication Data
US 2014/0026567 A1    Jan. 30, 2014

Related U.S. Application Data

(63) Continuation of application No. 13/811,413, filed as application No. PCT/US2011/045090 on Jul. 22, 2011, now abandoned.

(60) Provisional application No. 61/366,816, filed on Jul. 22, 2010.

(51) Int. Cl.
*F03G 7/06* (2006.01)
*B60K 16/00* (2006.01)
(Continued)

(52) U.S. Cl.
CPC ............... *F03G 6/001* (2013.01); *H01L 31/054* (2014.12); *H02S 40/38* (2014.12); *H02S 40/44* (2014.12); *Y02E 10/46* (2013.01); *Y02E 10/52* (2013.01); *Y02E 10/60* (2013.01)

(58) Field of Classification Search
CPC ......... F03G 6/001; H02S 40/44; H02S 40/38; H01L 31/054; Y02E 10/46; Y02E 10/60; Y02E 10/52

USPC .......... 60/641.1, 641.2, 641.8, 649; 429/419, 429/434, 498, 70
See application file for complete search history.

(56) References Cited

U.S. PATENT DOCUMENTS 3,906,250 A * 9/1975 Loeb ............................. 290/1 R
4,171,409 A   10/1979 Loeb
(Continued)

FOREIGN PATENT DOCUMENTS

WO    WO 2010-065791      6/2010

OTHER PUBLICATIONS

Notification of Transmittal of the International Search Report and The Written Opinion of the International Searching Authority received in PCT/2011/045090; mailed Dec. 29, 2011.
(Continued)

*Primary Examiner* — Hoang Nguyen
(74) *Attorney, Agent, or Firm* — Arent Fox LLP

(57) ABSTRACT

A system or methodology for converting thermal energy obtained from solar thermal, photovoltaic, geothermal or industrial waste heat into electrical power is disclosed. The energy efficient way of transferring two steams of liquid solutions containing different concentrations of ionic species is disclosed. The combination of thermal gradient in addition to concentration gradient to improve efficiency, reduce or avoid fouling is disclosed. This invention describes a method of efficient ion migration from concentrated stream to dilute stream thereby improving DC power generation process. The utilization of solar thermal energy from solar collector or concentrating photovoltaic (CPV) generator system or solar thermal power generation (CSP) system provides the additional driving force for ions transport from concentrated stream to dilute stream, apart from the concentration grading to generating power. The thermal power is also used to bring back the diluted steam to original concentration in the reverse Electro dialysis system. The utilization of CPV process heat or solar or waste heat for bringing back the dilute stream into the concentrated stream for next operation of ions gradient power generation is also disclosed in this invention.

7 Claims, 2 Drawing Sheets

(51) Int. Cl.
  *F03G 6/00* (2006.01)
  *H02S 40/38* (2014.01)
  *H01L 31/054* (2014.01)
  *H02S 40/44* (2014.01)

(56) References Cited

U.S. PATENT DOCUMENTS

| | | | |
|---|---|---|---|
| 4,862,708 A | | 9/1989 | Basiulis |
| 5,123,481 A | * | 6/1992 | Albers et al. ............ 165/111 |
| 5,613,362 A | * | 3/1997 | Dixon ............................ 60/649 |
| 6,185,940 B1 | * | 2/2001 | Prueitt ........................... 60/649 |
| 2004/0055955 A1 | * | 3/2004 | Davis ............................ 210/652 |
| 2006/0060532 A1 | * | 3/2006 | Davis ............................ 210/652 |
| 2009/0191436 A1 | | 7/2009 | Wunning et al. |
| 2010/0212319 A1 | * | 8/2010 | Donovan ....................... 60/649 |

OTHER PUBLICATIONS

International Preliminary Report on Patentability mailed Feb. 20, 2014 for International Patent Application No. PCT/US2011/045090.
Chukwuka & Folly (2014) *Journal of Power and Energy Engineering* 2: 1-8.
Singh (2013) *Energy* 53: 1-13.

* cited by examiner

THERMAL ENERGY CONVERSION TO ELECTRICITY

CROSS-REFERENCE TO RELATED APPLICATIONS

This application is a Continuation of U.S. patent application Ser. No. 13/811,413, filed Jan. 22, 2013, which is a national stage application of International Patent Application No. PCT/US2011/045090, filed Jul. 22, 2011, which claims priority to U.S. Provisional Patent Application No. 61/366,816, filed Jul. 22, 2010, the disclosures of each of which are herein incorporated by reference.

BACKGROUND OF THE INVENTION

1. Field of the Invention

The present invention is directed to processes for converting thermal energy in solar thermal collector/concentrator or co-concentrated solar PV (CPV) systems to electricity.

2. Description of the Related Art

Efficient means to convert energy and produce electricity is important given the increasing demand for electricity. Electricity is generated from thermodynamic engine cycles such as rankine, bryton, steam and gas turbines; hydroelectric and wind turbines as well as solar photovoltaic conversion. Electrochemical routes to generate electricity such as fuel cells, and reverse electrodialysis are also being developed for specific applications.

An enhanced ability to convert thermal energy into electricity offers the potential to improve the efficiency of heat engines and to produce electricity directly from low grade heat. Electricity thus produced would displace energy produced from non-renewable fossil fuels and thereby address concerns associated with fossil fuel use, including resource finiteness, environmental effects (e.g., global warming), and national security.

Myriad processes for conversion of thermal energy to electricity exist. These processes fall into two broad categories: 1) processes that utilize a working fluid to turn a turbine and 2) processes that do not. Turbine processes produce approximately 80% of the electricity consumed globally. Such processes utilize thermal energy to vaporize a compressed working liquid. The vapor is expanded through a turbine to produce electricity and subsequently condensed before recompression and reuse in the cycle.

The efficiency of turbine processes is determined by the efficiency of the underlying Rankine cycle for the working fluid. The efficiency is limited by the temperature difference between the vaporization and condensation steps—the greater the difference the higher the efficiency. The working fluid and operating pressure determine the maximum temperature of the process. This temperature is limited by the mechanical properties and cost of the materials used to construct the boiler and turbine.

As an alternative to the combustion of fossil fuels, solar thermal processes use concentrated solar energy to vaporize the working fluid and are capable of providing high grade thermal energy comparable to that produced from fossil fuels. Geothermal and ocean thermal (utilizing the temperature difference between surface and deep ocean water) sources of thermal energy also may be used. However, the thermal energy is available at lower temperatures, especially with ocean thermal sources, so process efficiency is lower. Waste or low-grade heat is available at low temperatures which inherently limits the efficiency of turbine processes that utilize it. Moreover, choices for working fluids are limited. Consequently, alternative processes for converting thermal energy to electricity are desirable.

Non-turbine processes include those that utilize thermoelectric materials and the Seebeck effect to produce electricity from a temperature difference imposed across bimetallic or p-n junctions. Thermo-electric devices possess the same efficiency limit as Rankine cycle devices.

An emerging area of power generation is the use of the salinity difference between sea water and fresh water runoff from estuaries into the ocean. Pressure retarded osmosis, reverse electrodialysis, and osmotic capacitor processes have been proposed to produce electricity from the mixing of solutions with different osmotic pressures.

Pressure retarded osmosis relies on water transport from a solution of lower osmotic pressure to a solution of higher osmotic pressure. The higher osmotic pressure stream is pressurized and water transport to it produces a flow that can be used to turn a turbine. Membranes that selectively allow water transport relative to salt transport are an essential component of the process.

Reverse electro-dialysis relies on ion transport from higher chemical potential regions to lower chemical potential regions. Membranes that selectively allow transport of either cations or anions are required in the process. Ion transport directly produces an electric current that can be utilized in an external circuit. Reverse electro-dialysis offers the advantage of not requiring a turbine to produce electricity.

The previous work on reverse Electrodialysis was mainly on the seawater and fresh water, or salt solution at ambient temperatures. U.S. Publication No. 2011/0086291A1 discusses mainly the fluid flow distribution pattern, spacing and flow velocity, membrane suitability etc and focuses more on the design geometry of salt solution at ambient temperatures. WO2010/143950A1 discusses fouling and its prevention in reverse electrodialysis by periodic osmotic shock. U.S. Pat. No. 4,171,409 discusses the reverse electrodialysis system for generation of power. Power production from a concentration gradient was first published in 1976 in Science, vol 191, pp 557-9. During the last few years, a lot of effort has been expended by several groups including that by Prof. J. Veerman and his group in Netherlands in reverse electrodialysis. This work specifically focuses on the utilization of process heat produced in the operation of concentrated PV systems and solar energy and waste energy for regeneration of spent feed solutions to its original values so that power production can be produced without the necessity of freshwater and seawater sources. Also, combined utilization of thermal gradient in addition to the salt gradient enhances the ion separation and power production. The increased temperature of operation also reduces the biofouling in the membranes.

In concentrator photovoltaic (CPV) power generation systems, the solar energy is concentrated on solar cells. Voltage drops with rise in temperature of the solar cell and this drop depends on the specific type of semiconductors and its temperature coefficient of voltage. To limit losses due to this voltage drop, it is necessary to cool the solar cell within the acceptable limits. This cooling provides a heat source that could be used as industrial pre-heating. That heat is utilized to produce electricity which in turn increases the overall efficiency of conversion of solar energy. The first is the conventional photovoltaic power generation efficiency which is typically from 15% to 36% depending on the type of the solar cell used in the concentrator. In addition to this, hot reverse electrodialysis produces additional electricity from the coolant waste heat at 45 to 50° C., in which the concentrated salt or ionic liquid solution is heated and circulated in reverse electrodialysis system to produced additional electricity. This approach is a novel way of improving the overall efficiency of the solar energy conversion process.

Similarly, waste heat obtained after expansion of steam in solar steam turbine generator, coolant waste heat produced in solar stirling engine generator, rankine turbine produces enhanced power output through the disclosed hot reverse Electrodialysis in this invention. The current invention paves the way for improving the overall efficiency of the solar thermal power generation process.

SUMMARY AND OBJECTS OF THE INVENTION

In one embodiment of the invention, electricity is produced from the mixing of at least two liquids having chemical potential differences existing due to temperature differences in said liquids. The temperature differences are produced using thermal energy provided by solar radiation or from process heat (in case of CPV) or geothermal heat or waste heat. In a preferred embodiment of the invention, the thermal energy is obtained from the concentrated photovoltaic power generation systems. Since increased temperature has a deleterious effect on many PV power production systems and requires cooling of solar cells 45 to 50° C., coupling the use of this process heat to drive efficient production of electricity creates a more efficient and more stable system. Certain types of ion permeation membrane systems are capable of operating at this temperature. Therefore, the heating fluid used for cooling the concentrated photovoltaic power plants can be efficiently used to generate DC power in-addition to the photovoltaic DC power output. Also, many large solar concentrated thermal power plants (CSP) that are operating at high temperature such as steam turbine-generators or stirling engine generators, do produce currently unusable low temperature waste heat at 40 to 60° C., which can be effectively and efficiently used to generate power by this disclosed invention. The disclosed system can also be operated using solar thermal concentrator systems with solar optical concentration ratios ranging from 2 to 30 to generate about 100 to 200° C. Any waste heat from industries or geothermal energy could also be utilized to produce power when needed.

The current invention is a process for converting thermal energy into electricity. In all configurations, a heat transfer step is used to change the chemical potential of a salt solution. Two solutions of different chemical potential are mixed to produce electricity in a power generation device. The overall process may be considered as an engine operating between the temperatures of the heat transfer process and ambient temperature.

The heat transfer step can be used to change chemical potential by changing solution concentration or temperature. The examples indicate an electrochemical device that produces power from two such differently concentrated salt solutions. The process has been generally termed as reverse electrodialysis. Almost all of the previous efforts were centered on the common salt with different geometries, flow distribution patterns, operating modes, minimization of fouling etc. at ambient temperature.

The current invention discloses the combined effect of temperature and concentration gradient for producing power. Process heat from concentrated photovoltaic power plant, or heat from thermal power plant, solar concentrator and collector systems, geothermal heat or waste heat, can be used constructively so that net efficiency of the process is considerably improved

BRIEF DESCRIPTION OF THE DRAWINGS

The schematic in FIG. 1 shows the block diagram of the process of producing electricity from hot and cold concentration gradients across membrane to produce the electricity.

The schematic diagram in the FIG. 2 illustrates two different modes of operation i.e. power generation mode illustrated in FIG. 2a and regeneration mode illustrated in FIG. 2b.

DETAILED DESCRIPTION OF PREFERRED EMBODIMENTS

The waste heat produced in concentrated solar power (CSP) plants is used to heat the concentrated salt/ionic liquid solution. The resulting hot solution is passed through the reverse electrodialysis (RED) module. Cooler, (i.e. 0-30° C.) and less concentrated salt/ionic-liquid solution is passed through the other side of the ion exchange membrane for collection of the ionic species from the concentrate side. The hot solution enhances the migration of ionic species through the ion exchange membrane. The selective migration of ions through the cation and anion exchange membranes in the reverse electrodialysis system generates DC power as illustrated in the schematic FIG. 1.

Figure 1:
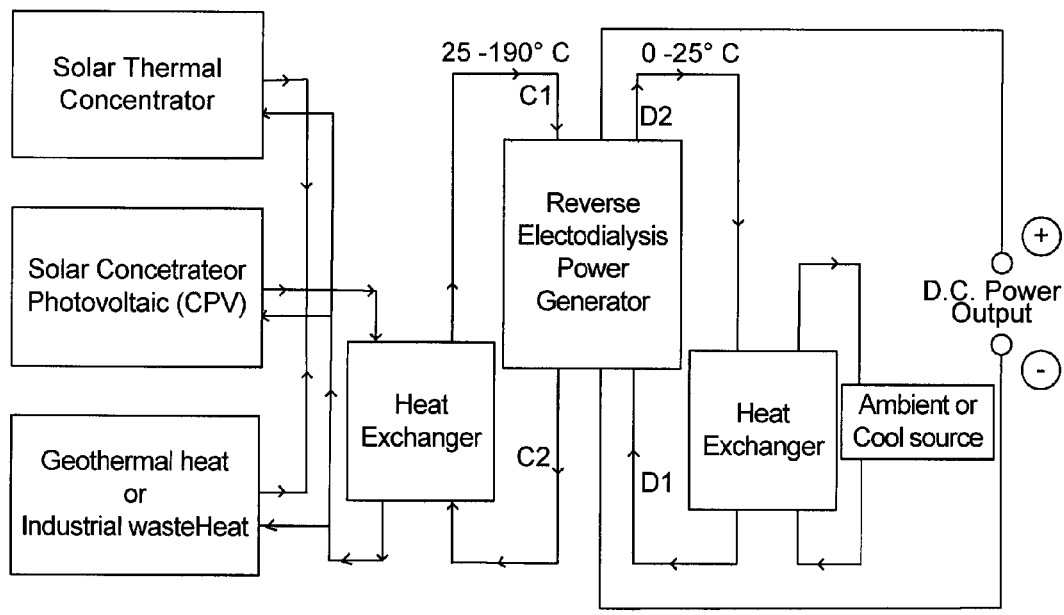

Referring to FIG. 1, C1 is initial concentration of the solution before power production. C2 is the slightly diluted solution after losing some ions through the membrane after power production. D1 is the initial concentration of the dilute solution. D2 is the increased concentration after gaining ions from the C1 solution.

Heating the ionic liquid after power generation for bringing back the concentration is carried out for next cycle of power generation. Therefore, heat from solar power plant (CSP or CPV) is used to bring the concentration C2 back to C1, so that, the next and subsequent power generation cycle can be continued. A specific amount of liquid with concentration D2 is reduced to D1 by adding the water recovered from the evaporation of C2 or adding external water depending of the water availability. The remaining liquid is added to C2 before concentrating it back in order to keep the specific concentration and amount of C1 and D1 for next operation of power production.

Referring to FIG. 2, TC and TD are the tanks containing concentrated solution and dilute solutions at the end of power generation mode of Reverse electrodialysis operation. TC contains salt solution of C2 concentration and TD contains salt solution of D2 concentration. D2a is a portion of D2 solution being mixed with C2 and heated with thermal energy obtained from concentrated solar power (CSP or CPV) systems or conventional solar collectors to separate the water vapor and increase the concentration back to C1 for next cycle of power generation. D2b is the other portion of the D2 solution, to which, water recovered from the solar concentrator system or external water is added to reduce the concentration back to its original value D1, so that the next power generation cycle could be started. RED is the reverse Electrodialysis unit.

Figure 2A:
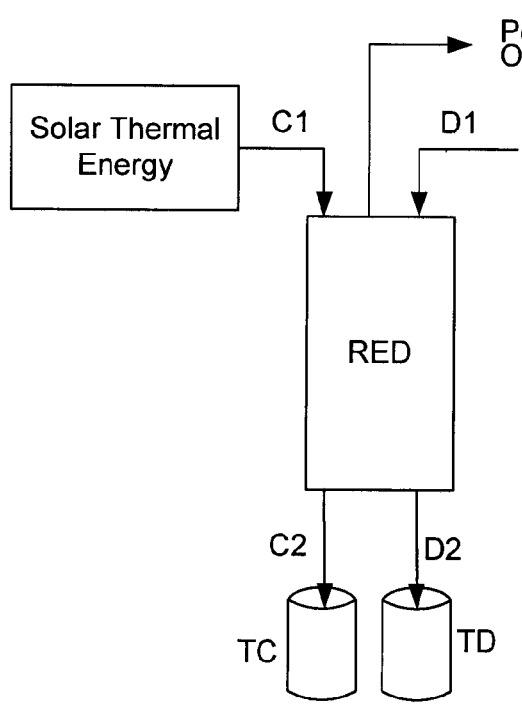

FIG. 2a illustrates the power generation mode of operation during which cycle, the concentrated salt stream C1 and diluted salt stream D1 are passed through the reverse electrodialysis system. The operation is either at ambient temperature or at elevated temperature. The elevated temperature gives additional benefit of enhancing the ion migration through the ion exchange membrane from both concentration gradient as well as temperature gradient. During this migration, ions and therefore charges are separated and collected at the electrodes thereby generating DC power. At the end of power generation mode of operation, the concentration in the concentrated stream becomes less due to the migration of ions to the dilute steam. This ion migration reduces the concentration from C1 to C2. After gaining ions, the concentration in the dilute stream D1 increases to D2.

Figure 2B:
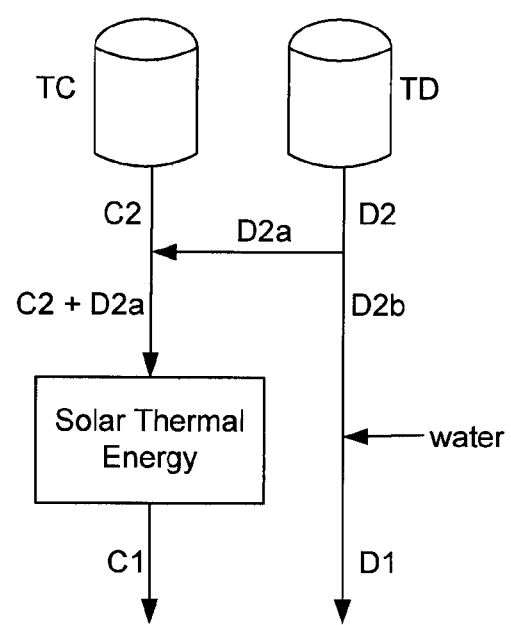

During the regeneration mode of operation illustrated in the FIG. 2b, the less concentrated stream C2 and more concentrated stream D2 are brought back to original concentrations of C1 and D1. This is done by mixing specific portion of D2 solution, i.e., D2a into C2, and then heating the solution to separate the water vapor till the concentration reaches C2. This heating is done by thermal energy obtained from the solar collectors, concentrators waste heat in CSP or CPV process heat. The remaining amount of D2 solution, i.e. D2b is diluted by water recovered from the separated and condensed vapor in the solar thermal system or fresh water from other source. This completes the regeneration cycle.

As the discussion of the Figures illustrates, disclosed herein is a process for converting thermal energy into electricity. A heat transfer step is used to change the chemical potential of a salt solution. Two solutions of different chemical potential are mixed to produce electricity in a power generation device. The overall process may be considered as an engine operating between the temperatures of the heat transfer process and ambient temperature. However, the process is not limited to the efficiency limits of the Carnot cycle.

The heat transfer step can be used to change chemical potential by changing solution temperature. In this embodiment of the invention, two recirculating salt streams are used. One stream is heated with the thermal energy source while the other is optionally cooled to near ambient temperature. The two streams are introduced into a reverse electro-dialysis cell to produce electricity from the chemical potential difference that exists due to the temperature difference between the two streams.

FIG. 2 illustrates an embodiment of a power generation cycle using thermal differences. In a particularly preferred embodiment of the invention, the thermal energy used to heat one of the two streams is provided by excess or waste energy, for example heat, produced during the operation of concentrated photovoltaic (CPV) power generation systems or Concentrated solar power (CSP) systems based on solar thermal power. In concentrated photovoltaic systems, it is essential to cool the photovoltaic cells, and the low temperature heat extracted could be used to produce by temperature gradient augmented reverse electrodialysis disclosed in this invention. This method provides a means to achieve higher solar to electric efficiency by the combined conventional solar photovoltaic energy conversion and the disclosed temperature gradient operated reverse electrodialysis system to produce additional power.

In one embodiment, the working salt solution is directly passed through the as active heat transfer medium or the salt solution is heated through heat exchanger in an active cooling system of concentrated photovoltaic (CPV) power generator to utilize the solar heat for production of additional power. This improves the overall solar to electric conversion efficiency.

In another embodiment, the working salt solution is directly heated or indirectly heated through heat exchanger in either concentrated solar power (CSP) power generation systems or conventional solar collector/concentrator system to heat the salt solution for separating the water to bring back to the original concentration of feed solution in reverse electrodialysis and as well as to raise the temperature to augment enhanced mode of operation of reverse electrodialysis by both thermal gradient as well as concentration gradient for separation of ionic species to generate power.

As the streams pass through the reverse electro-dialysis cell, electricity is produced and heat transfer increases the temperature of the cold stream and reduces the temperature of the hot stream. The temperature difference is restored through cooling and heating of the exiting streams. In an alternative configuration, the cooling and/or heating steps is integrated with the reverse electro-dialysis into a single device that does not require recirculation of the salt solutions. Such devices may require recirculation of a working heat transfer fluid.

By utilizing waste energy (i.e., heat) produced through the operation of solar thermal or (concentrated) photovoltaic cell electricity-producing systems to increase the temperature of one of said streams, some of the efficiency typically lost through the operation of solar thermal or photovoltaic cell electricity-producing systems is recovered.

In one embodiment, a device may consist of a panel structure in which one side of the panel is exposed to solar radiation (i.e., a panel of photovoltaic cell(s) or solar mirrors) and the reverse side contains one or a multitude of pipes for the movement of a heat transfer fluid. The exposed side is heated and heat is transferred through the panel to one or more pipes, resulting in heating of the heat transfer fluid. After the heat transfer fluid is circulated through a solar panel structure, the heated fluid is introduced into a reverse electro-dialysis cell in conjunction with a cooled or non-heated stream to produce electricity from the chemical potential difference that exists due to the temperature difference between the two streams.

In another embodiment of the invention, the heat transfer fluid is used to heat the hot side of the reverse electro-dialysis device through an integral heat exchange element. Likewise, a second heat transfer fluid is cooled by heat exchange to ambient air or another cooler environment such as the subsurface soil.

Energy storage is possible with the temperature driven configuration. For example, during the day, one or more of the pipes used for movement of the heat transfer fluid to the reverse electro-dialysis cell is alternatively directed to transfer fluid heated by solar energy for storage in an insulated vessel. A second vessel is used for storage of the cold fluid. Electricity is produced by withdrawing and mixing of these fluids in the reverse electro-dialysis device when no thermal heat source is available.

Numerous ion containing fluids and salts are used for energy production and storage. The salts can consist of single cation-ion pairs or mixed salts. Ionic liquids are also used for separation and combining ionic species. Additionally, an organic or inorganic acids also used in the formulation to improve solution conductivity.

EXAMPLES

Examples of reverse electro-dialysis power generation are provided to demonstrate feasibility of power generation. A commercial electrodialysis system (Electrosynthesis Company, Inc. Model ED-1) was modified to perform the experiment. Voltage and current measurements were performed with an electronic load (Programmable DC electronic load 3710A, made by Array Electronics Co. Ltd.). CMX cation and AMX anion membranes were purchased from Neosepta. Titanium mesh electrodes, coated with Ru—Ir mixed metal oxides (MMO) with dimensions of 12.5 cm×8.0 cm were used (De Nora Tech, Inc., USA).

Example 1

Dilute (0.017 M) and concentrated (0.51 M) aqueous KCl solutions were mixed using one cation-anion cell pairs separated by 250□ gaskets and spacers. The anode and cathode rinse was 0.05 M K3Fe(CN)6+0.05 M K4Fe(CN)6. A maximum power output of 0.36 Watts per square meter (W/m2) was observed.

Example 2

The same experimental conditions as in Example 1 were used except for the use of spacers with increased porosity. The porosity was increased from 51% to 70% by selectively removing small sections of the spacer. A maximum power output of 0.53 W/m² was observed.

Example 3

Dilute (0.017 M) and concentrated (0.51 M) aqueous KCl solutions were mixed using three cation-anion cell pairs separated by 125µ gaskets and spacers of 75% porosity. The anode and cathode rinse was 0.05 M $K_3Fe(CN)_6$+0.05 M $K_4Fe(CN)_6$. A maximum power output of 1.0 Watts per square meter (W/m²) was observed.

The present invention results in an increase in the overall efficiency of solar concentrated photovoltaic power (CPV) plant due to the additional power generated by this hot reverse electrodialysis system. The overall efficiency of concentrated solar power (CSP) generation in a solar power tower system employing steam turbine generator increases by this disclosed process due to the additional power generated by this hot reverse electrodialysis system. Likewise, the overall efficiency of concentrated solar stirling power generator increases by this disclosed process due to the additional power generated by this disclosed process of waste heat utilization. Also, the overall efficiency of concentrated solar power (CSP) generation involving rankine turbine generators increases by this disclosed process.

The combined operation of thermal gradient and concentration gradient reduces the stack resistance of the reverse electrodialysis system. In addition, the combined operation of thermal gradient and concentration gradient enhances the ion migration with improved power output.

The increased operating temperature of the reverse electrodialysis system reduces the tendency for bio-fouling of the membranes in the system. In a closed loop system, bio-fouling can be eliminated.

The initial concentrations of concentrate and dilute streams are regenerated back to its original values by utilizing the thermal energy from CPV process heat, solar thermal power generation systems, solar collectors, waste heat or geothermal heat. Repeated operations of reverse electrodialysis are possible at predetermined concentration ratios of solutions containing ionic species. The daytime heating of salt solution to higher concentrations and storing enables electric power production from solar energy during night time also without the necessity of storage batteries.

What is claimed is:

1. A method for converting thermal energy into electricity, comprising the steps of:
    (a) thermally heating a first salt stream with waste heat generated from the operation of a concentrated photovoltaic (CPV) power generation system and cooling a second salt stream;
    (b) adding water to a portion of the cooled salt stream so as to dilute the cooled salt stream; and
    (c) mixing said salt streams in a controlled manner to produce a mixture and capturing electricity produced during said mixing.

2. The method of claim 1, further comprising capturing the electricity using a reverse electro-dialysis cell.

3. The method of claim 1, further comprising mixing the streams in a pressure-retarded reverse osmosis cell coupled to a turbine to produce electricity.

4. The method of claim 1, further comprising subsequently separating the mixture into two streams that are heated and cooled, respectively.

5. The method of claim 1, further comprising placing the thermally heated and optionally cooled streams into insulated storage vessels for utilization during times when the thermal heat source is not available.

6. The method of claim 1, wherein the salts comprise single cation-ion pairs or mixed salts.

7. The method of claim 1, wherein the water added to a portion of the cooled salt stream is from the concentrated photovoltaic power generation system.

* * * * *